United States Patent [19]

Eisermann

[11] Patent Number: 5,172,062
[45] Date of Patent: Dec. 15, 1992

[54] DEVICE FOR TESTING ELECTRICAL APPLIANCES USED IN A MOTOR VEHICLE

[75] Inventor: Günter Eisermann, Karlsfeld, Fed. Rep. of Germany

[73] Assignee: MAN Nutzfahrzeuge A.G., Munich, Fed. Rep. of Germany

[21] Appl. No.: 534,757

[22] Filed: Jun. 7, 1990

[30] Foreign Application Priority Data

Jul. 15, 1989 [DE] Fed. Rep. of Germany ....... 3923545

[51] Int. Cl.⁵ ............................................ G01R 31/00
[52] U.S. Cl. .................... 324/503; 324/511; 364/424.04
[58] Field of Search ............... 324/503, 511, 537, 549; 364/424.03, 424.04, 431.01

[56] References Cited

U.S. PATENT DOCUMENTS

| 4,207,611 | 6/1980 | Gordon | 324/503 |
| 4,363,105 | 12/1982 | Plessmeir | 324/511 |
| 4,752,959 | 6/1988 | Matsumoto | 324/503 |
| 4,757,463 | 7/1988 | Balloy | 364/424.04 |
| 4,796,206 | 1/1989 | Boscove et al. | 364/551.01 |
| 4,853,850 | 8/1989 | Krass, Jr. et al. | 364/424.03 |
| 4,901,025 | 2/1990 | Hirano et al. | 324/537 |

FOREIGN PATENT DOCUMENTS

| 1914281 | 10/1970 | Fed. Rep. of Germany | 324/503 |
| 2605114 | 8/1977 | Fed. Rep. of Germany | 324/503 |
| 3024266 | 1/1981 | Fed. Rep. of Germany . | |
| 8526253.6 | 10/1985 | Fed. Rep. of Germany . | |
| 3237164 | 10/1986 | Fed. Rep. of Germany . | |
| 3412734 | 11/1986 | Fed. Rep. of Germany . | |
| 3616506 | 11/1987 | Fed. Rep. of Germany . | |
| 3643579 | 6/1988 | Fed. Rep. of Germany . | |
| 3740482 | 6/1990 | Fed. Rep. of Germany . | |
| 2458199 | 12/1981 | France | 324/503 |
| 66167 | 3/1987 | Japan | 324/503 |

Primary Examiner—Jack B. Harvey
Assistant Examiner—Maura K. Regan
Attorney, Agent, or Firm—Ladas & Parry

[57] ABSTRACT

An apparatus and method for testing electrical loads such as appliances connected with a DC source in a motor vehicle. The loads receive their signals causing them to operate from an electronic control unit. The latter is connected with a diagnostic computer in a manner so as to comply with the industrial standard DIN/ISO 9141. The diagnostic program is stored in the computer, for instance on a diskette. During a test, a precision resistor or shunt is connected in the current path between the DC source and the load. When the load to be tested has been turned on by the diagnostic computer the precision resistor leads to produces a voltage drop dependent on the current flow in the load. Such voltage drop is measured and compared in the diagnostic computer with a rated value specific for the load. If there is a difference the size of the difference provides information indicating the nature of the fault or malfunction of the load.

11 Claims, 4 Drawing Sheets

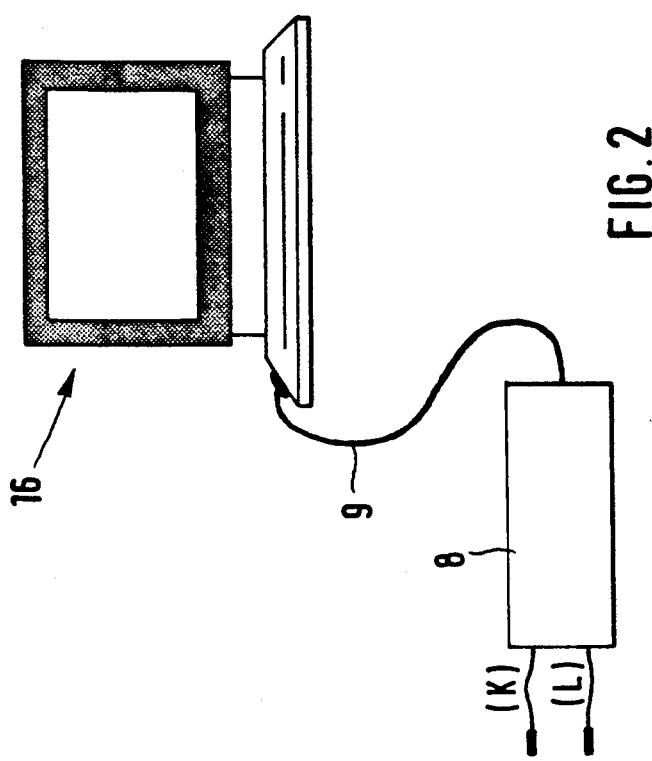
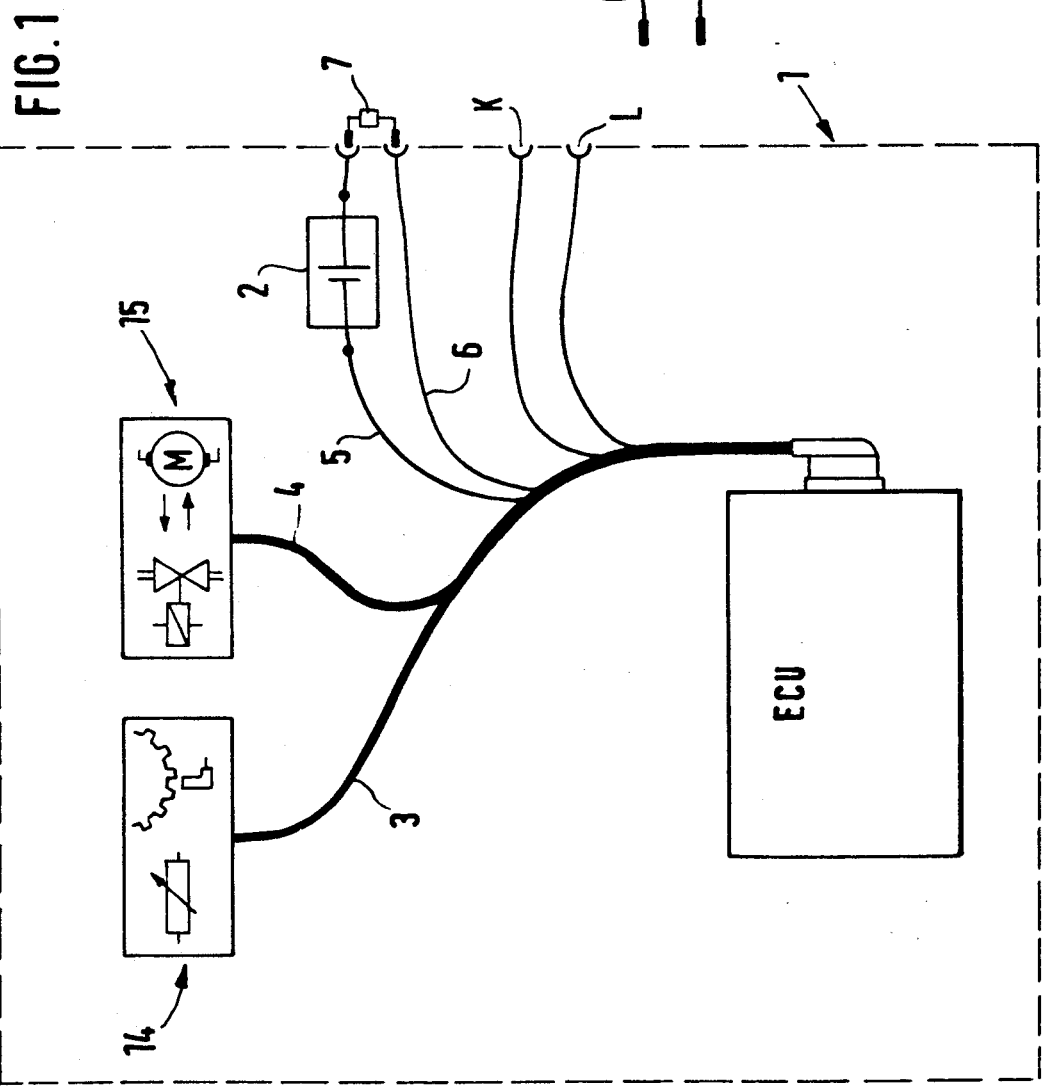

DEVICE FOR TESTING ELECTRICAL APPLIANCES USED IN A MOTOR VEHICLE

BACKGROUND OF THE INVENTION

The invention relates to the testing of electrical loads, such as appliances, connected with a DC supply in a motor vehicle and which are adapted to receive control signals from an electronic control unit which is adapted to be connected with a diagnostic computer, for instance via an interface adapter, so that testing may be performed by running test software in the computer, stored for instance on a diskette.

The invention takes as a starting point a diagnostic system for road vehicles as described in the standard specification DIN/ISO 9141, dated September 1987. This standard specifies the requirements for an exchange of digital information between electronic control units of motor vehicles and diagnostic testing equipment. This exchange of information is intended to facilitate the checking, testing, diagnosis and adjustment of vehicles, systems and electronic control units. FIG. 1 of the standard (shown in FIG. 1 herein) shows in this connection the relevant features of a vehicle, while FIG. 2 on the other hand shows the respective diagnostic unit. In FIG. 1 the vehicle is denoted by a dotted outline 1. To the extent that they are relevant for the present purpose the parts of the electrical system of the vehicle are: the battery 2, constituting the power source to supply the electrical loads such as drive motors, servo motors, electromagnets, actuators and the like denoted generally by 15, the measuring and detecting means generally denoted 14 and the electronic control unit ECU. The latter receives signals from the sensors 14 via wires 3. The loads of appliances 15 receive their control signals from the electronic control unit ECU via suitable control lines 4.

The electronic control unit ECU is furthermore connected with the DC supply 2 via suitable power lines 5 and 6. In the power line 6 a replaceable fuse 7 is connected to protect the main power line. Furthermore to comply with the said standard DIN/ISO 9141 the electronic control unit ECU has either only one single communication connection K or two communication connections K and L which make it possible to establish the diagnostic or testing connection with the diagnostic unit 8 and 16 for the testing routine. The main parts of the diagnostic unit are the diagnostic computer 16, which may be in the form of a computer already present in the workshop as more or less standard equipment, such as a personal computer, or device which may be carried for place to place by the test staff, which, in accordance with the specific application, is able to be connected using one communication line (K), or two lines (K) and (L), or, if the electronic control unit ECU and the diagnostic computer 16 are not part of the same data transmission system, with an interface adapter 8 with a serial interface 9 (as for instance an RS 232 interface). It is stated in paragraph 4.1 of the said standard DIN/ISO that electronic control units have to have one or two communication connections (K) or, respectively, (K) and (L) for checking the testing operation and the diagnosis. Furthermore it is necessary for the battery voltage and the common return line for the diagnostic device have to be able either on the electronic control unit ECU or on the vehicle 1. If the lines K and L of two or more electronic control units ECUs are connected together, the resulting system is termed a bus system. The line K is defined as the like, which transmits the information in a digital and serial form from the electronic control unit ECU to the diagnostic computer 16. The line K may also be used bidirectionally; in this case it may also transmit control signals or data from the diagnostic computer 16 to the electronic control unit ECU. The line K may also be used to initialize serial communication. The line L is defined as the unidirectional line from the diagnostic computer 16 to the electronic control unit ECU. If the latter is present if may be used to initialize the serial communication and/or to transmit control signals or data or both. It will be seen from this account that the line K may be either unidirectional or bidirectional and the line L may be omitted, so that it is only possible to have the following four configurations:

1 A bidirectional line K with a unidirectional line L.
2 a unidirectional line K with a unidirectional line L
3 A bidirectional line K without any line L.
4 A unidirectional line K without any line L.

In each of the four cases it is possible to initialize in some other way, that is to say as an alternative to the use of the lines K and L. Page 4 of the said Standard DIN-/ISO 9141 shows various configurations of the systems and gives details regarding on the function of the communication lines K and L. Chapter 4.2 (page 5) shows the principle of a setup for testing.

Although this standardization of the testing and diagnostic procedures, of the devices for use therein and the adaptations of the vehicles meet normal requirements there is one problem in connection with the structure and function of the electronic control unit ECU: although on the basis of the existing hardware and installed software such an electronic control unit to perform a selftest with a non-volatile storage of the fault and to check the frequency of the fault, the electronic control unit is not in a position of ascertaining the electrical power requirements of the individual electrical loads or appliances 15. That is to say, the electronic control unit is only able check the operational or nonoperational condition of the electrical appliances on the basis of two possible states without any intermediate values. However, specific information about the "quality" or "size" of a defect in the respective electrical load which would be extremely helpful to make a systematic and expert repair to the unit concerned.

SUMMARY OF THE INVENTION

Accordingly one object of the present invention is to specify possibilities of testing electrical loads in a motor vehicle using comparatively simple means so as to detect defects or faults in a reliable manner on the basis of the methods of the said Standard DIN/ISO 9141.

In order to achieve this or other objects appearing from the present specification, claims and drawings, the invention provides an apparatus including a precision resistor which during testing is placed in the current path between the DC source and electrical loads and after activation of the load to be tested by a diagnostic computer provides a voltage drop dependent on the current requirement of the said load and such voltage drop is compared in the diagnostic unit with a standard value specific to the said load and in the case of a difference, the magnitude of the difference is used to provide exact information about a fault in the load of an error in its function, as for instance a short circuit, resistance at its terminals, entire failure, short circuit of windings and the like.

In accordance with one possible form of the invention the precision shunt has a highly consistent resistance value and is adapted to provide for high precision data measurement.

It is possible for the precision shunt to be adapted to be fitted in the place of a fuse in the vehicle equipment or it may be an independent unit.

Furthermore, it is possible for the precision shunt to be designed as a unit with the interface adapter, and then furthermore the interface adapter may have not only normal terminals for the lines K and L but also terminals for the shunt.

Generally speaking, and without in any way intending to limit the scope of the invention, it may be said that for testing a precision shunt is placed in the current path between the DC source and the load, i.e. the appliance or other instrumentality forming part of the equipment of the automobile, so that when the load is activated by the diagnostic computer the shunt produces a voltage drop proportional to the current requirement of the said load. This voltage drop is measured and is compared in the diagnostic unit with a rated value specified for the load. If the comparison shows that there is a deviation between the measured and rated values the size of the deviation will provide precise information as to the actual defect in the load or the nature of its malfunction and such information will appear as a message on the screen of the diagnostic computer or in printed form as a test record such as "short circuit in . . . ", "contact resistance in part . . . ", "total failure of part . . . " or "winding insulation breakdown . . . " and the like.

This precision shunt represents a relatively simple and cheap component whose purchase price is more or less insignificant but whose effect leads to a substantial improvement.

The invention will now be described in more detail with reference to the FIGS. 3 through 5 of the accompanying drawings.

BRIEF DESCRIPTION OF THE SEVERAL VIEWS OF THE DRAWINGS

FIG. 1 is a diagrammatic view of an electronic control unit and appliances connected therewith in a motor vehicle.

FIG. 2 shows a diagnostic computer.

DETAILED DESCRIPTION OF WORKING EMBODIMENTS OF THE INVENTION

Figure 3:
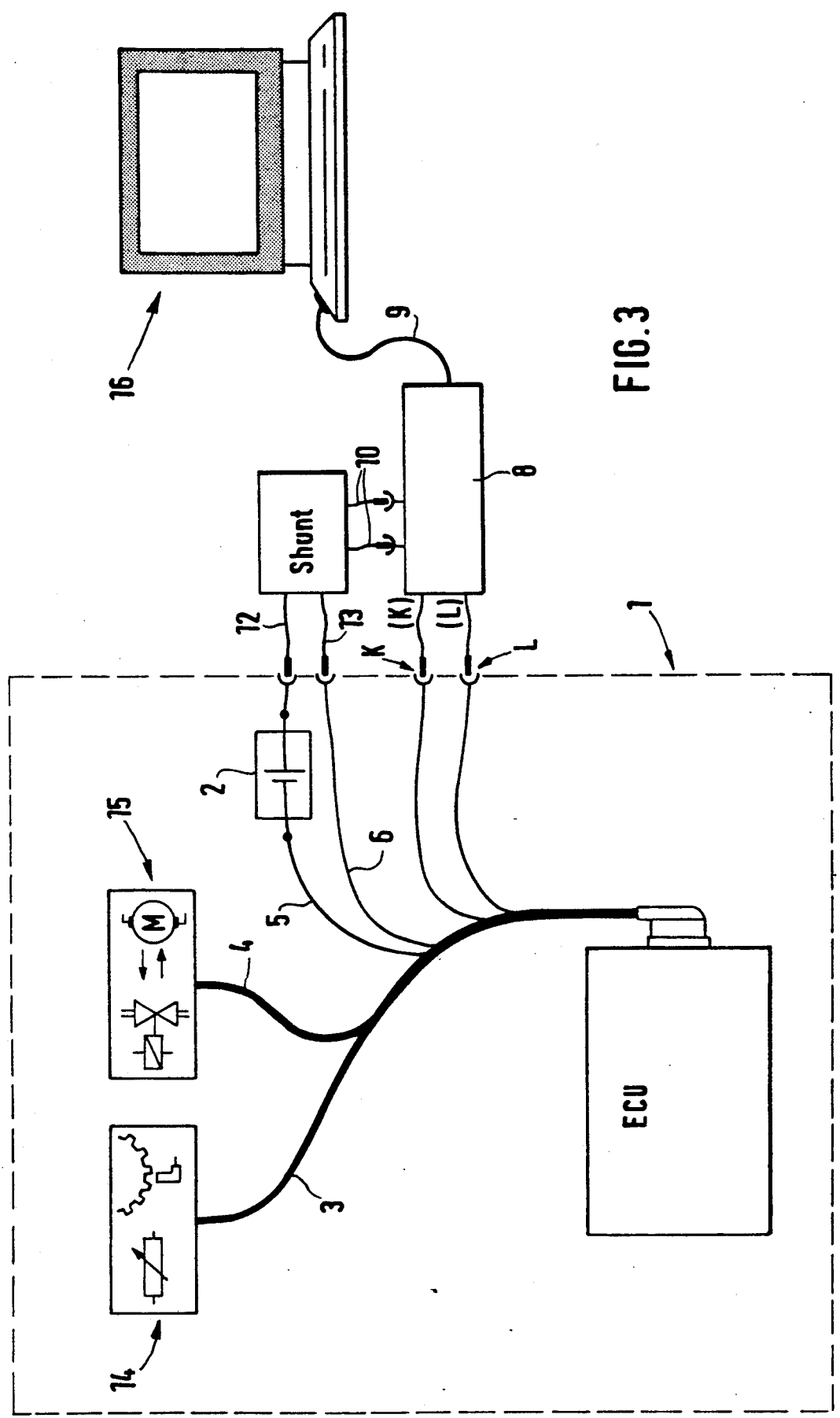
FIG. 3 shows a first possible form of the invention.
Figure 4:
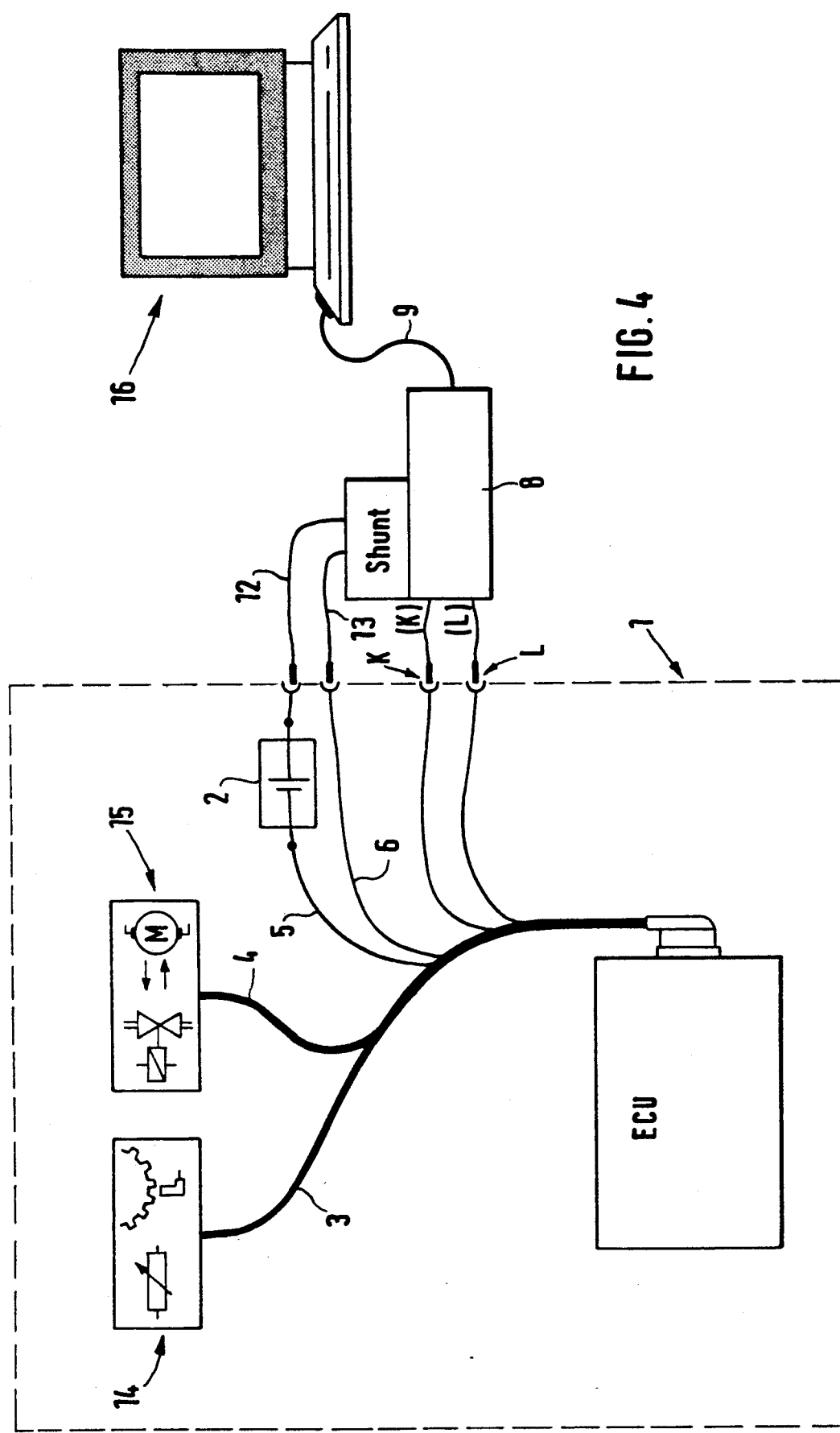
FIG. 4 shows a further form of the invention.
Figure 5:
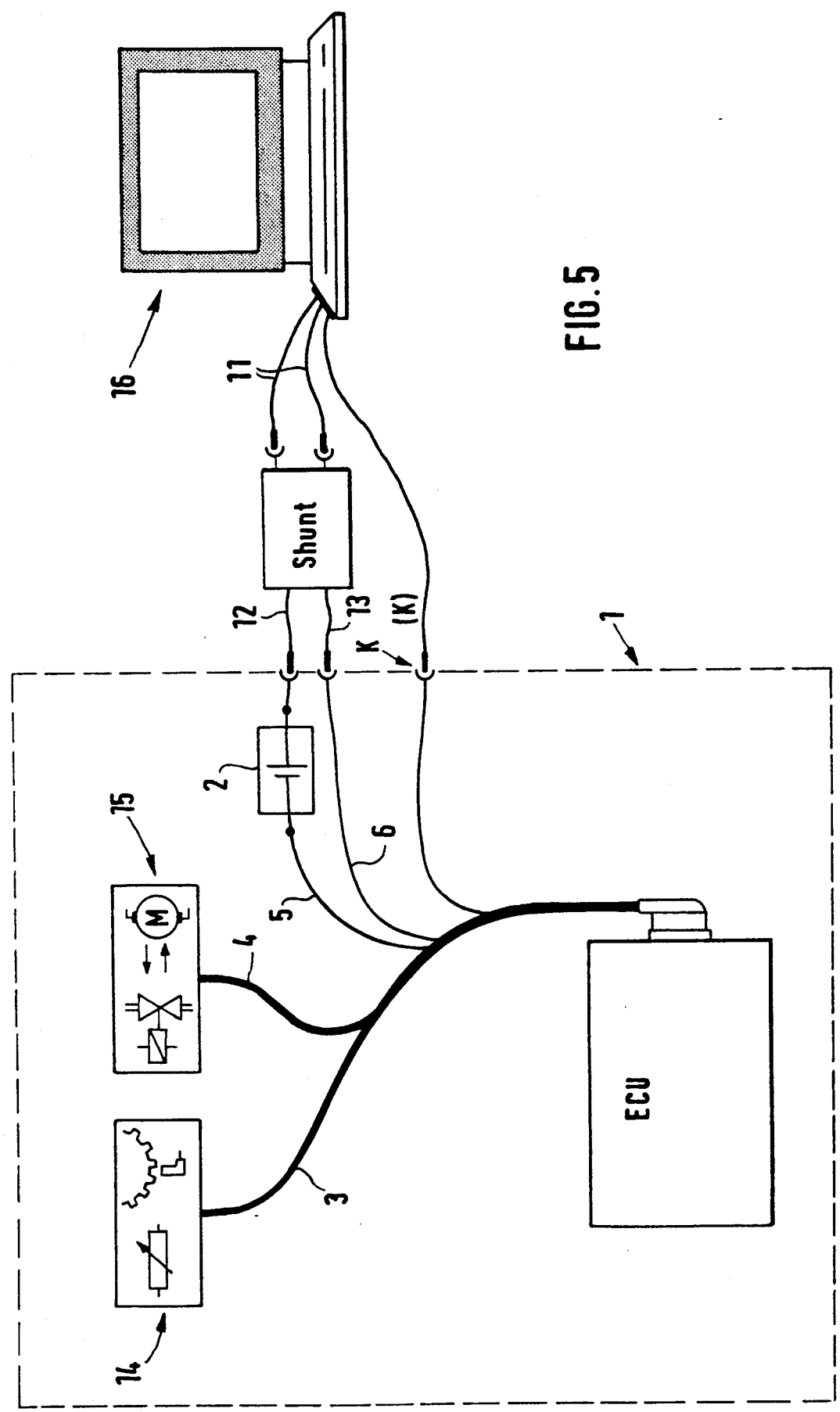
FIG. 5 is a view of a third possible embodiment of the invention.

FIG. 3 shows the diagnostic unit 8 and 16 connected on the same general lines as in the arrangement in FIG. 2 and adapted for testing equipment of a motor vehicle 1 as shown in FIG. 1. One of the vehicle fuses is replaced by the precision resistor which is characterized by a highly stable resistance value so that high precision readings may be taken. In the case of FIG. 3 the precision resistor is an independent component from which the readings are supplied via suitable leads 10 to the interface adapter 8 and processed in the latter. In the case of the design of FIG. 4 the precision resistor in accordance with the invention forms a single unit with the interface adapter 8, from which the readings taken are passed via leads or channels (not shown) to a processing circuit provides in the interface adapter 8. FIG. 5 shows a device in which the diagnostic computer is controlled by the same system as the electronic control unit ECU of the vehicle 1 so that in this case it is possible to dispense with the interface adapter and it is only necessary to provide one data transmission line (K) between a corresponding terminal K of the electronic control unit ECU and the diagnostic computer 16.

The precision resistor in accordance with the invention as a shunt may be connected so that its two terminals 12 and 13 are connected with other wires of the power supply system between the DC source 2 and the electronic control unit ECU.

The testing program or testing software of the diagnostic computer 16 is stored on a suitable data storage medium such as a diskette. When during testing a control signal is supplied by the diagnostic computer 16 via the electronic control unit ECU for the operation of a load to be tested, a current flows from the DC source 2 via the precision resistor in accordance with the present invention to the load under test. There will then be a voltage drop at the precision resistor as a function of the current flow in the load and such voltage drop is measured between the terminals 12 and 13 and the respective reading passed to the diagnostic unit for evaluation. There are suitable means for this, as mentioned, either in the interface adapter 8 or in the diagnostic computer 16. The voltage drop occurring at the precision resistor in accordance with the present invention is then compared with a rated value specific for the load in question. If there is a difference between the two values the size thereof will provide exact information as to the specific nature of the fault or malfunction occurring in the electrical load under test. Since the result of diagnosis directly appearing from this will immediately be visible to the testing engineer, since a corresponding message appears on the screen of the diagnostic computer 16 or in the form of a test report printed by the printer of the computer, the engineer will immediately be able to take steps to provide a remedy on the basis of the fault or malfunction indicated.

The removal of an electrical load having a fault or functioning incorrectly in order to exactly examine the component as previously necessary is made superfluous by the precision resistor in accordance with the present invention or shunt. In fact, minor defects may be dealt with while the electrical load or component is still in place on the vehicle.

What is claimed is:

1. A device for testing an electrical load connected with a DC supply in a motor vehicle which receives control signals from an electronic control unit connected with a diagnostic computer for running test software, said device comprising precision resistor means placed in the current path between the DC source and the electrical load and, after activation of the load to be tested by a diagnostic computer, provides a voltage drop dependent on the current flow through said load, means for connecting said precision resistor means so that the diagnostic computer receives information related to the voltage drop in said precision resistor means, means for detachably connecting said precision resistor means in said current path between the DC source and the electrical load, said precision resistor means being related to said electrical load being tested, and means for comparing the voltage drop in the diagnostic computer with a standard value specific to the said load and in the case of a difference, the magnitude of the difference is used to provide exact information about a fault in the load or an error in its function, said means for detachably connecting said precision resistor means in said current path comprising a connection means in said current path, means for detachably connecting a circuit element in said current path at said connection means and means for connecting said precision resistor means to said connection means in said current path in replacement of said circuit element.

2. A device as claimed in claim 1 further comprising said means for detachably connecting said precision resistor means in said current path comprises connections in said current path by which said resistor means is replaceably connected in said current path.

3. A method for testing an electrical load connected with a DC supply in a motor vehicle to receive control signals from an electronic control unit which is connected with a diagnostic computer for running test software, said method comprising selectively and removably placing a precision resistor in the current path between the DC source and an electrical load such that the precision resistor corresponds to the particular load under test and, after activation of the load to be tested by diagnostic computer, producing a voltage drop in said resistor dependent on the current flow in said load, comparing said voltage drop in the diagnostic computer with a standard value specific to the said load and in the event of a difference producing exact information about fault in the load or an error its function based on the magnitude of said difference, and wherein a circuit element is contained in the current path between the DC source and the electrical load under test, said method further comprising removing said circuit element and effecting the selective placement of the precision resistor by connecting the precision resistor in said current path in replacement of said circuit element.

4. The method as claimed in claim 3 further comprising detachably connecting said precision resistor to said interface adapter.

5. The method as claimed in claim 3 further comprising integrating said precision resistor and said interface adapter.

6. The method as claimed in claim 3 further comprising directly and detachably connecting said resistor to said diagnostic computer.

7. The method as claimed in claim 3 further comprising forming said circuit element as a fuse.

8. A device for testing an electrical load connected with a DC supply in a motor vehicle to receive control signals from an electronic control unit connected with a diagnostic computer for running test software, said device comprising precision resistor means placed in the current path between the DC source and the electrical load and after activation of the load to be tested by a diagnostic computer provides a voltage drop dependent on the current flow through said load, means for connecting said precision resistor means so that the diagnostic computer receives information related to the voltage drop in said precision resistor, means for detachably connecting said precision resistor means in said current path between the DC source and the electrical load, said precision resistor means being related to said electrical load being tested, and means for comparing the voltage drop in the diagnostic computer with a standard value specific to the said load and in the case of a difference, the magnitude of the difference is used to provide exact information about a fault in the load or an error in its function, said precision resistor means comprising a precision resistor or shunt which maintains a highly consistent resistance value and thus enables highly precision readings to be taken of the current flow through the related load, said precision resistor being connected to the terminals of a main vehicle fuse after the removal of such fuse.

9. The apparatus as claimed in claim 8, further comprising the precision resistor is in the form of an independent component.

10. The apparatus as claimed in claim 8, further comprising the precision resistor or shunt forms a single structural unit with said interface adapter.

11. The apparatus as claimed in c claim 8 further comprising the precision resistor is integrated as a part of an interface adapter and the latter includes terminals for the detachable connection of the precision resistor to the current path in addition to its normal terminals.

* * * * *